United States Patent [19]

Coe

[11] Patent Number: 4,777,521
[45] Date of Patent: Oct. 11, 1988

[54] HIGH VOLTAGE SEMICONDUCTOR DEVICES

[75] Inventor: David J. Coe, East Grinstead, England

[73] Assignee: U. S. Philips Corporation, New York, N.Y.

[21] Appl. No.: 154,498

[22] Filed: Feb. 4, 1988

Related U.S. Application Data

[63] Continuation of Ser. No. 777,067, Sep. 17, 1985, abandoned.

[30] Foreign Application Priority Data

Sep. 26, 1984 [GB] United Kingdom ................ 8424296

[51] Int. Cl.$^4$ ..................... H01L 29/78; H01L 29/90; H01L 29/40; H01L 27/02
[52] U.S. Cl. ................................ 357/23.8; 357/23.4; 357/13; 357/41; 357/53
[58] Field of Search ....................... 357/13, 23.4, 23.8, 357/41.43, 53, 51, 23.14

[56] References Cited

U.S. PATENT DOCUMENTS

| | | | |
|---|---|---|---|
| 4,003,072 | 1/1977 | Matsushita et al. | 357/13 |
| 4,300,150 | 11/1981 | Cocak | 357/23.8 |
| 4,419,684 | 12/1983 | Sakai et al. | 357/23.4 |
| 4,422,089 | 12/1983 | Vaes et al. | 357/13 |
| 4,543,596 | 10/1985 | Strack et al. | 357/20 |
| 4,561,003 | 12/1985 | Tihanyi et al. | 357/23.4 |
| 4,561,003 | 12/1985 | Tihanyi et al. | 357/23.14 |
| 4,584,593 | 4/1986 | Tihanyi | 357/41 |
| 4,626,880 | 12/1986 | Nguyen Minh et al. | 357/23.4 |
| 4,631,564 | 12/1986 | Neilson et al. | 357/23.4 |
| 4,642,674 | 2/1987 | Schoofs | 357/53 |

FOREIGN PATENT DOCUMENTS

| | | | |
|---|---|---|---|
| 2087648 | 5/1982 | United Kingdom | 357/23.4 |
| 2161649 | 1/1986 | United Kingdom | 357/23.8 |

Primary Examiner—Martin H. Edlow
Assistant Examiner—Donald Featherstone
Attorney, Agent, or Firm—Thomas A. Briody; Algy Tamoshunas; Steven R. Biren

[57] ABSTRACT

A high voltage semiconductor device includes a two-dimensional array of polygonal regions in a higher resistivity body portion of the opposite conductivity type. The p-n junction between these regions and the body portion may be, for example, a drain junction of a D-MOS transistor or a collector junction of a bipolar transistor and is reverse-biased in at least a high voltage mode of operation. In order to relieve the high electric field at the corners of the polygonal regions, a plurality of further regions is distributed in each area of the body portion between facing corners of three or more of the polygonal regions. These further regions of the same conductivity type as the polygonal regions are located on at least one line from each of these corners in a symmetrical arrangement of the further regions within each area.

10 Claims, 2 Drawing Sheets

HIGH VOLTAGE SEMICONDUCTOR DEVICES

This is a continuation of application Ser. No. 777,067, filed Sept. 17, 1985, now abandoned.

BACKGROUND OF THE INVENTION

This invention relates to high voltage semiconductor devices, particularly but not exclusively power transistors of the insulated-gate field-effect type or of the bipolar type.

High voltage semiconductor devices are known having, at a major surface of a semiconductor body, polygonal regions of one conductivity type regularly arranged as a two-dimensional array in a higher resistivity body portion of the opposite conductivity type. Each of the polygonal regions forms with the body portion a p-n junction which is reverse-biased in at least a high voltage mode of operation of the device. Such devices may be designed to handle high voltages in excess of, for example, 100 volts and often very much higher. In the case of a bipolar transistor, the body portion may form part of the collector, the polygonal regions may form the base, and an emitter region of said opposite conductivity type may be provided in the polygonal base regions. In the case of a field-effect transistor (FET) of the so-called "D-MOS" type, the body portion may form a drain drift region, and a source region of the opposite conductivity type may be provided in the polygonal regions at the surface of which a channel is induced in operation between the source region and the drain drift region by a voltage applied to an overlying gate. It is also possible to merge FETs and bipolar transistors in the same device structure.

It has already been proposed to include further regions of the one conductivity type in intermediate parts of the body portion between the polygonal regions so as to improve the electrical field distribution which occurs in the body portion, between facing corners of the polygonal regions. Such a proposal is described at length in U.S. Pat. No. 4,642,674. The whole contents of this copending patent application are hereby incorporated by reference in the present application. According to the teaching in this copending patent application, the field distribution is improved by providing a further region of the one conductivity type in each area of the intermediate parts which is located between facing corners of three or more of the polygonal regions. It is considered that in this arrangement an acceptable compromise is obtained between the series resistance in the intermediate parts of the body portion and the breakdown voltage which is dependant on the electrical field distribution. A high voltage device having a similar further region between six triangular power MOSFET regions in a two-dimensional array is shown in the paper entitled "3D Numerical Analysis of Power MOSTs" by the present inventor et al in Proc. NASECODE II, Galway, June 1983, pages 102 to 106. Analysis by the present inventor indicates that the high electric field distribution at the corners of the polygonal regions is reduced by increasing the area occupied by the further region in the intermediate parts of the body portion but that this increases the series resistance by obstructing the current path in these intermediate parts. Furthermore in power D-MOS transistors having this construction the high fields can not only reduce the breakdown voltage but more importantly can reduce the punch-through voltage of D-MOS transistors having low threshold voltages. This punch-through occurs between the drain drift region and the source region.

SUMMARY OF THE INVENTION

According to the present invention there is provided a high voltage semiconductor device having, at a major surface of a semiconductor body, polygonal regions of one conductivity type regularly arranged as a two-dimensional array in a higher resistivity body portion of the opposite conductivity type, each of the polygonal regions forming with the body portion a p-n junction which is reverse-biased in at least a high voltage mode of operation of the device, and further regions of the one conductivity type in intermediate parts of the body portion between the polygonal regions, characterized in that a plurality of further regions is distributed in each area of the intermediate parts which is located between facing corners of three or more of the polygonal regions, said further regions being located on at least one line from each of the corners in a symmetrical arrangement of the further regions within each area.

It has been found that such a symmetrical arrangement of a plurality of said further regions in said areas of the intermediate parts surprisingly permits an even better compromise to be obtained between series resistance in the intermediate parts of the body and the electrical field distribution between facing corners of the polygonal regions. Such a distribution of the further regions in each area in accordance with the invention can function as a progressively-stepped potential distributor between the facing corners of the three or more polygonal regions without significantly obstructing a current path through these intermediate parts. This permits a reduction in the likelihood of punch-through induced by the high field at the corners of D-MOS transistor regions, even with transistors having low threshold voltages.

When the polygonal regions are part of an insulated-gate field-effect transistor, the insulated-gate may even extend over these further regions in the intermediate parts of the body portion, whereas in the particular FETs described in both European Patent Application EP-A 0 132 861, corresponding to U.S. Pat. No. 4,642,674, and in the NASECODE II paper the insulated gate has openings over the single further region so as not to overlie this region.

BRIEF DESCRIPTION OF THE DRAWING

These and other features in accordance with the invention will be illustrated more specifically, by way of example, in embodiments of the invention now to be described with reference to the accompanying diagrammatic drawing, in which.

Figure 1:
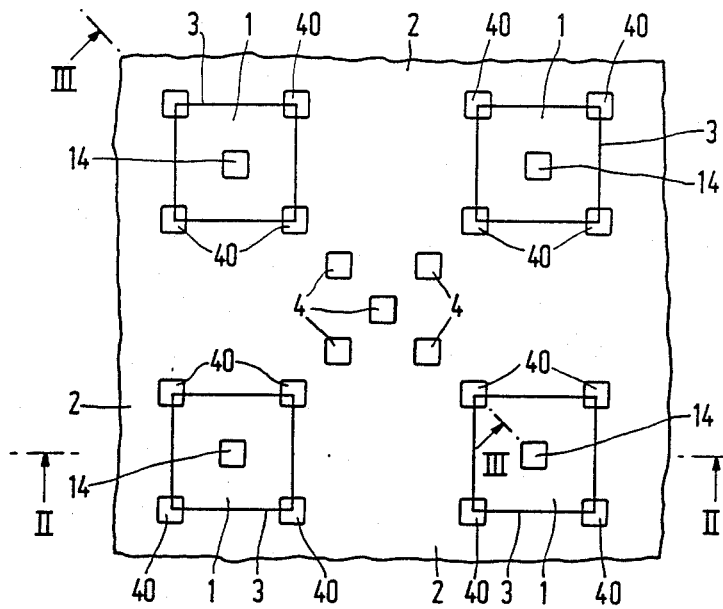
FIG. 1 is a plan view of part of a semiconductor device in accordance with the invention, in which the polygonal regions each have a rectangular outline.

It should be noted that the Figures are diagrammatic and not drawn to scale. The relative dimensions and proportions of parts of these Figures have been shown exaggerated or diminished for the sake of clarity and convenience in the drawings. The same reference signs as used in one embodiment are generally used when referring to corresponding or similar parts in other embodiments.

DESCRIPTION OF THE PREFERRED EMBODIMENTS

Figure 2:
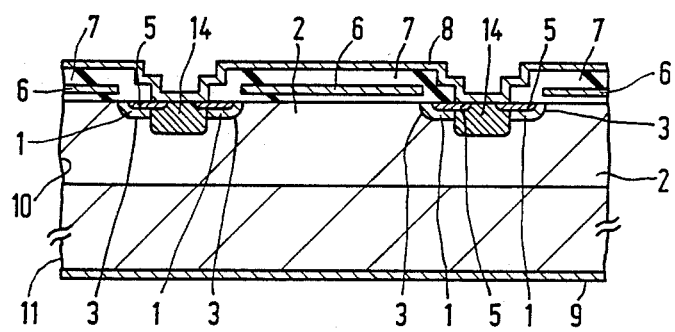
FIG. 2 is a cross-section on line II—II of FIG. 1 for a D-MOS transistor.
Figure 3:
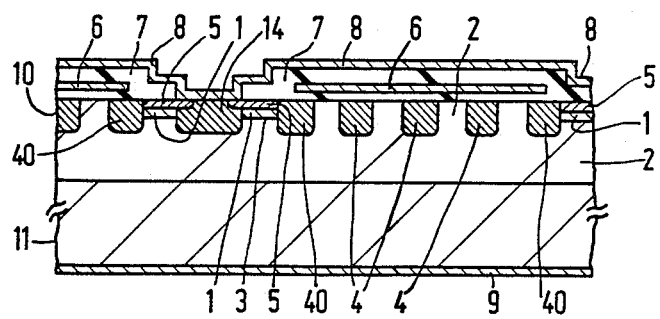
FIG. 3 is a cross-section on line III—III of FIG. 1 for the D-MOS transistor.

FIGS. 1 to 3 illustrate one example of a high voltage semiconductor device in accordance with the present invention. The device comprises a semiconductor body 10 having an upper major surface (shown in plan view in FIG. 1) at which polygonal regions 1 of one conductivity type (p type in the example) are arranged as a two-dimensional array in a higher resistivity body portion 2 of the opposite conductivity type (n type in the example). Only a central part of the array is illustrated in the drawings. Each of the polygonal regions 1 forms with the body portion 2 a p-n junction 3 which is reverse-biased in at least a high voltage mode of operation of the device. Further regions 4 of the same conductivity type (p type) as the polygonal regions 1 are present in intermediate parts of the body portion 2 between the regions 1. In the example of FIG. 1, the regions 1 each have a rectangular outline at the major surface and are aligned in a X-Y array.

In accordance with the present invention, a plurality of the further regions 4 is distributed in each area of the intermediate parts which is located between facing corners of four of the rectangular regions 1. These regions 4 are located serially along a line from each of said corners in a symmetrical arrangement of the regions 4 within each area. In the example of FIG. 1 these lines extend as diagonals from the facing corners of the regions 1 to the center of the area and then through the center to the corner of the diagonally opposite region 1. FIG. 1 illustrates five regions 4 in each of the areas, the center of which is occupied by one of the regions 4. Furthermore, in the example shown, additional regions 40 are present at the beginning of each line to overlap the corner of the region 1 from which they extend.

As the reverse-bias across the p-n junction 3 is increased, a depletion layer formed at each junction 3 spreads through the serial arrangements of these further regions 4, progressively and symmetrically from the corners of the polygonal regions 1. These further regions 4 then float at potentials near that of the adjacent polygonal regions 1 and act as a progressively stepped potential distributor along this surface area, thus relieving the field at the corners of the regions 1. This surface potential distribution is illustrated in FIG. 4 in which V(s) is the surface potential and the horizontal axis represents the position of different regions at the surface.

Figure 4:
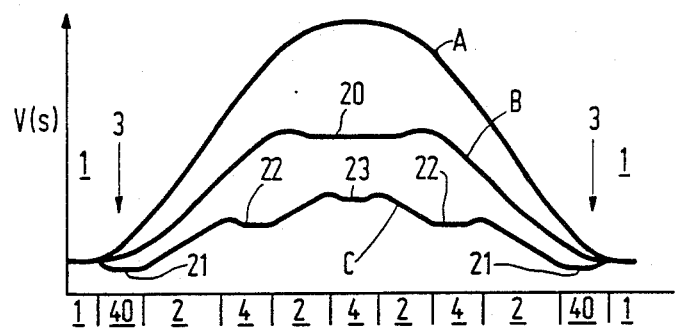
FIG. 4 is a representation of surface potential along the part of the line III—III of FIG. 1 which extends between the facing corners of the opposite regions 1.

In FIG. 4, line A represents the situation with no additional regions 4, line B represents the situation with a single large region 4 such as suggested in the NASE-CODE II paper, and line C represents the situation of FIG. 1 having the five further regions 4, i.e. three along each line between regions 40 at facing corners of diagonally opposite regions 1.

In the absence of the further regions 4 (line A), the reverse-biased p-n junctions 3 would have a high electrostatic field occuring in the depletion layer at the corners of the polygonal regions 1. This high field can be reduced by decreasing the spacing between the regions 1 but the device series resistance is then increased by pinching off the current flow in the intermediate part between the regions 1. The further regions 4 provide field-relief by reducing the curvature of equipotential lines in the depleted intermediate part of body portion 2 at these corners. If only a single region 4 is introduced into each area between the corners (line B) the current path in this area can be significantly restricted when the single region 4 occupies a large proportion of the area so as to provide significant field-relief at the corners. As soon as the depletion layer has punched through to such a single further region 4, a single equi-potential 20 is established in that area. A less serious restriction of the current path results from providing a symmetrical serial arrangement of the further regions 4 within each of said areas, as illustrated by line C, and a progressive potential distribution is obtained stepping through equipotentials 21, 22 and 23. By overlapping the regions 40 at the beginning of each line with the corner of the region 1, good field-relief can be obtained at these corners. This is particularly useful for mitigating a reduction in the punch-through voltage of D-MOS transistors having low threshold voltages.

Each of the polygonal regions 1 in FIG. 1 has a contact zone 14 which is deeper than (see FIGS. 2 and 3) and surrounded by the remaining active portion of the region 1. The plurality of further regions 4 (and the regions 40) can often be formed conveniently in the same doping step as the contact zones 14, by merely modifying the mask layout for this doping step. In this way, the regions 4 may be formed with substantially the same doping concentration and depth as the contact zones 14. This is advantageous since the effectiveness of the field-relief can be improved by having such deeper further regions 4.

Symmetrical serial arrangements of the further regions 4 in accordance with the invention may be used for field-relief with many different types of high-voltage semiconductor devices. Thus, for example, the p-type polygonal regions 1 in FIG. 1 may be anode regions of a power rectifier, or base regions of a bipolar power transistor. In the case of a bipolar transistor, n type emitter regions will be provided in the p type base regions 1. FIGS. 2 and 3 illustrate a particular device in which the polygonal regions 1 form part of an insulated-gate field effect transistor which is of the D-MOS type in this specific example. By choosing the resistivity of the body portion 2, semiconductor devices in accordance with the present invention can be designed to handle voltages well in excess of 100 volts, for example voltages of 200 or 400 or even 1,000 volts applied between the device terminals to reverse-bias the p-n junctions 3 between the polygonal regions 1 and the body portion 2. Then, by choosing the spacings, transverse dimensions and depths of the further regions 4 between the polygonal regions 1, the ON-resistance of the device can be optimized.

The D-MOS transistor of FIGS. 1 to 3 is of conventional form, apart from the provision of the symmetrical serial arrangements of further regions 4 in accordance with the present invention. Thus, n type source regions 5 are present in the polygonal p type regions 1, and an insulated gate 6 on the upper major surface of the body 10 extends over the intermediate parts of the body portion 2 between the polygonal regions 1. In operation, a conductive channel is induced at the surface of the polygonal regions 1 between the source regions 5 and these intermediate parts of the body portion 2, by applying a voltage to the overlying gate 6.

In the cross-sections of FIGS. 2 and 3 the different parts of the insulating layer structure 7 at the upper major surface of the body 10 are not distinguished with different reference signs, for the sake of simplicity and clarity in the drawing. An electrode layer 8 contacts the source regions 5 and p type contact zones 14 at windows in the insulating layer structure 7 and provides the source terminal connection of the transistor. A further electrode layer (not shown) which provides the gate terminal connection is present at this same surface of the device and contacts the insulated gate 6 at one or more windows in the insulating layer structure 7.

The body portion 2 forms the drain-drift region of this D-MOS transistor and may be of epitaxially-grown silicon on a highly conductive monocrystalline silicon substrate 11 of the same conductivity type (n type) which forms the drain region. This drain region 11 may be contacted at the back major surface of the body 10 by an electrode layer 9 which provides the drain terminal connection of the transistor.

In the example illustrated in FIG. 3 the insulated gate 6 extends over the further regions 4 in the intermediate parts of the body portion 2, and may be in the form of a grid which covers the whole of the intermediate area between the polygonal regions 1 as well as the channel areas of the regions 1. This device structure can be simpler to manufacture, as compared with a similar D-MOS transistor in which the regions 4 are present below openings in the gate layer 6, assuming that it is desirable to have deep contact zones 14 in the device. Thus, the final gate structure 6 may be formed after the contact zones 14 and regions 4 and may then be used as a mask in the doping steps to provide the source regions 5 and active portions of regions 1. Only a crudely-aligned mask is required for the regions 4 during the provision of the source regions 5. However, an insulated-gate field-effect transistor in accordance with the invention may have a gate layer 6 with openings over the further regions 4, particularly for example if the regions 4 are formed in the same doping step as the active portions of the polygonal regions; in this case the transistor may or may not have deeper contact zones 14.

Figure 5:
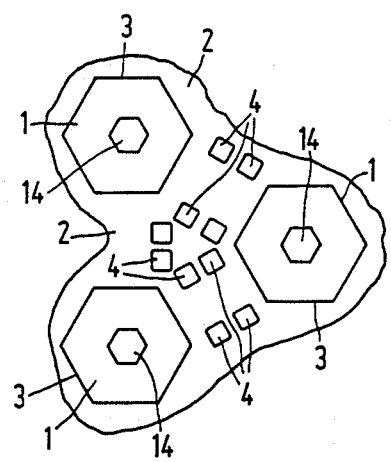
FIG. 5 is a plan view of part of another semiconductor device in accordance with the invention, in which the polygonal regions each have an hexagonal outline.
Figure 6:
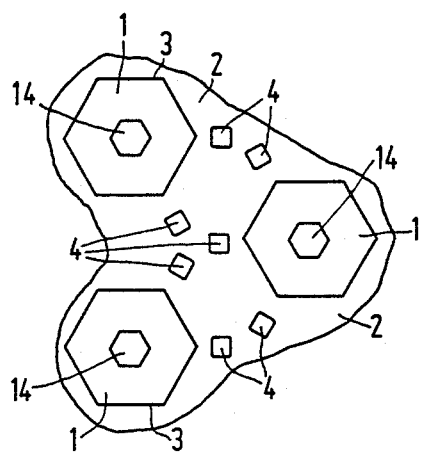
FIG. 6 is a modification of the device of FIG. 5, also in accordance with the present invention.

It will be evident that different symmetrical arrangements of regions 4 in accordance with the invention are possible, both for polygonal regions 1 of rectangular outline and for polygonal regions 1 of different outline. Thus, in a modification with triangular regions 1 the regions 4 are distributed in each area of the intermediate body parts 2 which is located between facing corners of six regions 1 of triangular outline at the upper major surface of the body 10; these regions 4 may be located serially along diagonal lines through the center of each of the areas. FIGS. 5 and 6 illustrate other modifications of symmetrical arrangements of further regions 4 with polygonal regions 1 of hexagonal outline. For the sake of simplicity in the drawing, additional regions such as source regions 5 are not illustrated in FIGS. 5 and 6.

In the arrangement of FIG. 5 six regions 4 are distributed in each of said areas between facing corners, these regions 4 being located serially along lines which extend from the corner of one hexagonal region 1 to the adjacent corner of an adjacent hexagonal region 1. These lines do not extend through the centers of said areas. In the arrangement of FIG. 6 three regions 4 are distributed in each of said areas between facing corners, each of these three regions 4 being located on a line which extends from the facing corners of the three hexagonal regions 1 to the center of the area between said corners. In this case, the regions 4 do not extend serially in a straight line between corners of the adjacent hexagonal regions 1.

What I claim is:

1. A high-voltage semiconductor device, which comprises:
   a low-resistivity semiconductor body of a first conductivity type and having a major surface;
   a surface-adjacent epitaxial layer of said first conductivity type and of higher resistivity than that of said semiductor body at said major surface;
   a plurality of polygonal regions of a second conductivity type opposite to said first type regularly arranged in two-dimensional array in said epitaxial layer, each of the polygonal regions forming with the epitaxial layer a p-n junction which is reverse-biased in at least a high voltage made of operation of the device; and
   a plurality of further regions of said second conductivity type in intermediate parts of the epitaxial layer between the polygonal regions, a plurality of said further regions being distributed in each area of the intermediate parts which is located between facing corners of three or more of the polygonal regions, said further regions being located on at least one line from each of said corners in a symmetrical arrangement of the further regions within each area.

2. A device as claimed in claim 1, wherein said further regions are located serially along at least one line from each of said corners.

3. A device as claimed in claim 2, wherein in addition to said further regions there is provided at the beginning of each line another region which overlaps the corner of the polygonal regions from which that line extends.

4. A device as claimed in claim 1, 2 or 3, wherein the further regions are located on lines which extend from the facing corners of the three or more polygonal regions to at least the center of the area between said corners.

5. A device as claimed in claim 1, 2 or 3 wherein, the further regions are located on lines which extend from the corner of one of said three or more polygonal regions to the corner of another of said three or more polygonal regions.

6. A device as claimed in claim 5, wherein, said polygonal regions each have a rectangular outline at said major surface.

7. A device as claimed in claim 5, wherein said polygonal regions each have an hexagonal outline at said major surface.

8. A device is claimed in claim 1, 2 or 3, in which each of said polygonal regions has a contact zone which is deeper than and surrounded by an active portion of the region, and wherein said further regions have substantially the same doping concentration and depth as the confact zones.

9. A device as claimed in claim 1, 2 or 3, wherein said polygonal regions form part of an insulated-gate field-effect transistor, and an insulated gate is provided on the major surface of the body and extends over the intermediate parts of the body portion between the polygonal regions.

10. A device as claimed in claim 9, wherein the insulated gate extends over said further regions in said intermediate parts.

* * * * *